(12) United States Patent
Perkins

(10) Patent No.: US 10,175,565 B1
(45) Date of Patent: Jan. 8, 2019

(54) LIGHT PULSE SYSTEM

(71) Applicant: CHRISTIE DIGITAL SYSTEMS USA, INC., Cypress, CA (US)

(72) Inventor: Michael Perkins, Kitchener (CA)

(73) Assignee: CHRISTIE DIGITAL SYSTEMS USA, INC., Cypress, CA (US)

(*) Notice: Subject to any disclaimer, the term of this patent is extended or adjusted under 35 U.S.C. 154(b) by 0 days.

(21) Appl. No.: 15/843,503

(22) Filed: Dec. 15, 2017

(51) Int. Cl.
  *G03B 21/20* (2006.01)
  *H05B 37/02* (2006.01)
  *G02B 26/00* (2006.01)
  *G03B 21/00* (2006.01)

(52) U.S. Cl.
  CPC ....... *G03B 21/2053* (2013.01); *G02B 26/008* (2013.01); *G03B 21/204* (2013.01); *G03B 21/2066* (2013.01); *H05B 37/0227* (2013.01); *G03B 21/008* (2013.01)

(58) Field of Classification Search
  None
  See application file for complete search history.

(56) References Cited

U.S. PATENT DOCUMENTS

| | | | |
|---|---|---|---|
| 5,204,867 A | 4/1993 | Koschmann | |
| 5,291,505 A | 3/1994 | Nielsen | |
| 5,339,323 A | 8/1994 | Hunter et al. | |
| 5,982,790 A * | 11/1999 | Grossman | H01S 3/13 372/10 |
| 6,008,929 A | 12/1999 | Akimoto | |
| 7,116,688 B2 | 10/2006 | Sauter et al. | |
| 2006/0197469 A1 | 9/2006 | Kim | |

* cited by examiner

*Primary Examiner* — Jany Richardson
(74) *Attorney, Agent, or Firm* — Perry + Currier, Inc.

(57) ABSTRACT

A system and method for controlling the energy of light pulses for use with a projection optics system is provided. The system includes a light source configured to emit light pulses, a transmission element configured to transmit a first part and a second part of an active light pulse, the first part being transmitted to the projection optics system, and a feedback system including a detector configured to receive the second part of the active light pulse and determine a total measure of energy of the active light pulse, and a control unit configured to receive the total measure of energy and in response control an amplitude of a subsequent light pulse. In some implementations, the control unit may additionally set a threshold value for communication to a comparator to compare against the total measure of energy and in response control the width of the active light pulse.

17 Claims, 7 Drawing Sheets

LIGHT PULSE SYSTEM

FIELD

The disclosure relates generally to projection systems, and more particularly to a light pulse system for use with a projection optics system.

BACKGROUND

In laser-phosphor projection systems, the light from a pump laser is directed towards a phosphor material. The phosphor is typically bonded to a substrate and mounted on a spinning wheel to distribute the thermal load over a wider surface area. In single chip DMD applications, the pump laser is pulsed synchronously to the bit planes. The light output from the spinning phosphor wheel will vary in intensity around the circumference of the wheel, causing non-linearity in the output response of a projector's light engine. Current methods to linearize the response require that the variations be consistent with each rotation of the wheel and that the speed of the wheel can be adequately controlled. Thermal variations in the phosphor on the wheel and jitter in the speed control may invalidate these requirements.

SUMMARY

As indicated above, this disclosure is directed to a light pulse system for use with a projection optics system. The light pulse system is configured to calibrate and control the light pulses that are emitted.

In this disclosure, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some implementations, the terms are understood to be "within 10%," in other implementations, "within 5%", in yet further implementations, "within 1%", and in yet further implementations "within 0.5%".

According to an aspect of the present disclosure, a light pulse system for use with a projection optics system is provided. The light pulse system includes a light source comprising a pump laser configured to emit laser pulses, a current drive configured to supply a current to the pump laser, and a conversion element configured to convert the laser pulses to light pulses; a transmission element configured to transmit a first part and a second part of an active light pulse, the first part being transmitted to the projection optics system; and a feedback system comprising a detector configured to receive the second part of the active light pulse and determine a total measure of energy of the active light pulse and a control unit configured to receive said total measure of energy of the active light pulse and in response control an amplitude of a subsequent light pulse by adjusting the current from the current drive to the pump laser.

In some implementations, the feedback system further comprises a comparator for receiving a threshold value and said total measure of energy of the active light pulse and causing the control unit to stop the active light pulse when said total measure exceeds said threshold value, thereby controlling a width of the active light pulse.

In some implementations, the control unit is further configured to set the threshold value.

In some implementations, the light pulse system further comprises a programmable digital-to-analog converter configured to receive the threshold value from the control unit and to communicate the threshold value to the comparator.

In some implementations, the transmission element comprises a partially transmissive mirror configured to reflect the first part of the active light pulse to the projection optics system and transmit the second part of the active light pulse to the feedback system.

In some implementations, the detector comprises a photodiode configured to receive the second part of the active light pulse and convert it to an electric current; and an integrator coupled to the photodiode to receive the electric current and to integrate the electric current to determine the total measure of energy of the active light pulse.

In some implementations, the light pulse system further comprises an analog-to-digital converter configured to receive total measure of energy of the active light pulse and cause the control unit to control the amplitude of the active light pulse in accordance with the total measure of energy of the active light pulse.

In some implementations, the conversion element of the light source comprises a dichroic filter and a phosphor wheel configured to receive laser pulses from the pump laser and generate colored light pulses for the projection optics system.

In some implementations, the conversion element of the light source comprises a dichroic filter and a static phosphor element configured to receive laser pulses from the pump laser and generate colored light pulses for the projection optics system.

In some implementations, the control unit is further configured to receive bit plane data and to control a width of the active light pulse according to the bit plane data.

In some implementations, the control unit is further configured to receive bit plane data and to control the amplitude of the active light pulse and the subsequent light pulse according to the bit plane data.

In some implementations, the control unit is further configured to receive bit plane data and to set the threshold value according to the bit plane data.

According to another aspect of the present disclosure, a method of controlling an energy of a pulse emitted by a light source is provided. The method comprises: activating the light source to emit an active light pulse; measuring a part of the active light pulse to determine a total measure of energy of the active light pulse; deactivating the light source to end the active light pulse; and controlling an amplitude of a subsequent light pulse in response to the total measure of energy of the active light pulse.

In some implementations, the method further comprises: setting a threshold value for the total measure of energy of the active light pulse; comparing the total measure of energy of the active light pulse against the threshold value; and deactivating the light source when the threshold value has been met or exceeded by the total measure of energy of the active light pulse.

In some implementations, the measuring comprises: receiving the part of the active light pulse and converting it to an electric current and integrating the electric current to determine the total measure of energy of the active light pulse.

In some implementations, the method further comprises receiving bit plane data, and wherein the deactivating comprises deactivating the light source to end the active light pulse according to the bit plane data.

In some implementations, the method further comprises receiving bit plane data and controlling an amplitude of the active light pulse according to the bit plane data.

In some implementations, the method further comprises receiving bit plane data and setting the threshold value according to the bit plane data.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
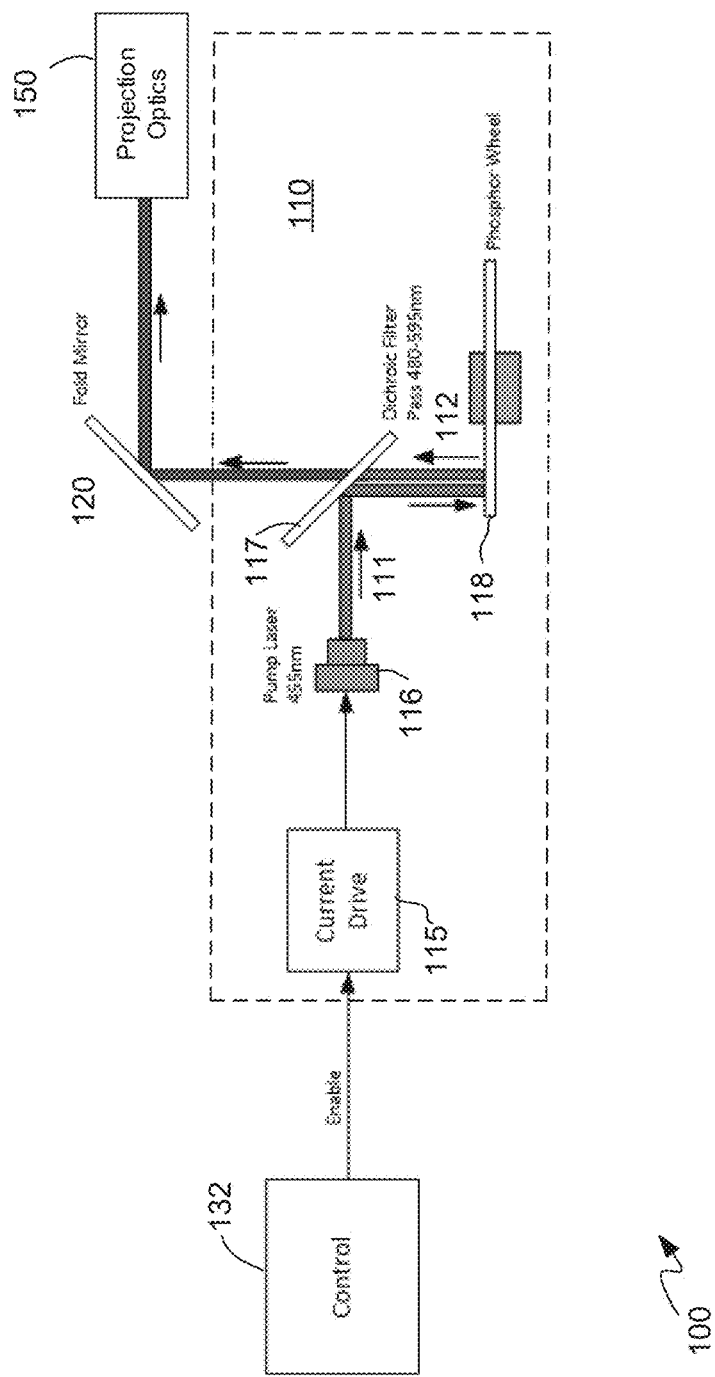
FIG. 1 depicts a light pulse system, according to the prior art.

Attention is first directed to FIG. 1 which is a block-schematic representation of a system 100 according to the prior art. The system 100 comprises a light source 110 configured to emit light pulses 112 for use with a projection optics system 150. The light source 110 comprises a pump laser 116 configured to emit laser pulses, and a current drive 115 configured to supply a current to the pump laser 116.

In the present example, the light source 110 further comprises a dichroic filter 117 and a phosphor wheel 118. The dichroic filter 117 and the phosphor wheel 118 are configured to convert the laser pulses emitted by pump laser 116 to light pulses. The dichroic filter 117 is a spinning color wheel which alternates between red, green and blue segments. In other implementations, the light source 110 may comprise independent pump lasers 116 for each of the red, green and blue channels and a static dichroic combiner to combine the colors, or is otherwise suitably configured to emit red, green, and blue light pulses to the projection optics system 150.

The system 100 further comprises a transmission element 120 and a control unit 132. In the present example, the transmission element 120 is a fold mirror configured to direct the light pulses 112 to the projection optics system 150. The control unit 132 is operatively coupled to the light source 110. Specifically, the control unit 132 is coupled to the current drive 115 of the light source 110 to enable and disable the current drive 115. The current drive 115 in turn is configured to activate and deactivate the current to the pump laser 116 to cause the pump laser 116 to emit laser pulses 111. The dichroic filter 117 and the phosphor wheel 118 receive the laser pulses 111 and convert the laser pulses 111 into light pulses 112, thus causing the light source 110 to emit light pulses 112. For example, the control unit 132 may be configured to cause the light source 110 to emit light pulses 112 in accordance with bit plane requirements for a digital micromirror device (DMD) projector system.

The light pulses 112 of the system 100 are uncalibrated. The performance of components of the light source 110, including the pump laser 116 and the phosphor wheel 118, may not be consistent between pulses, causing the light pulses 112 to be inconsistent. Specifically, the light pulses may not emit an accurate and precise amount of light required for a given bit plane. For demanding video applications, such as high dynamic range projection, the light pulses 112 produced by the light source 110 require high consistency.

Figure 2:
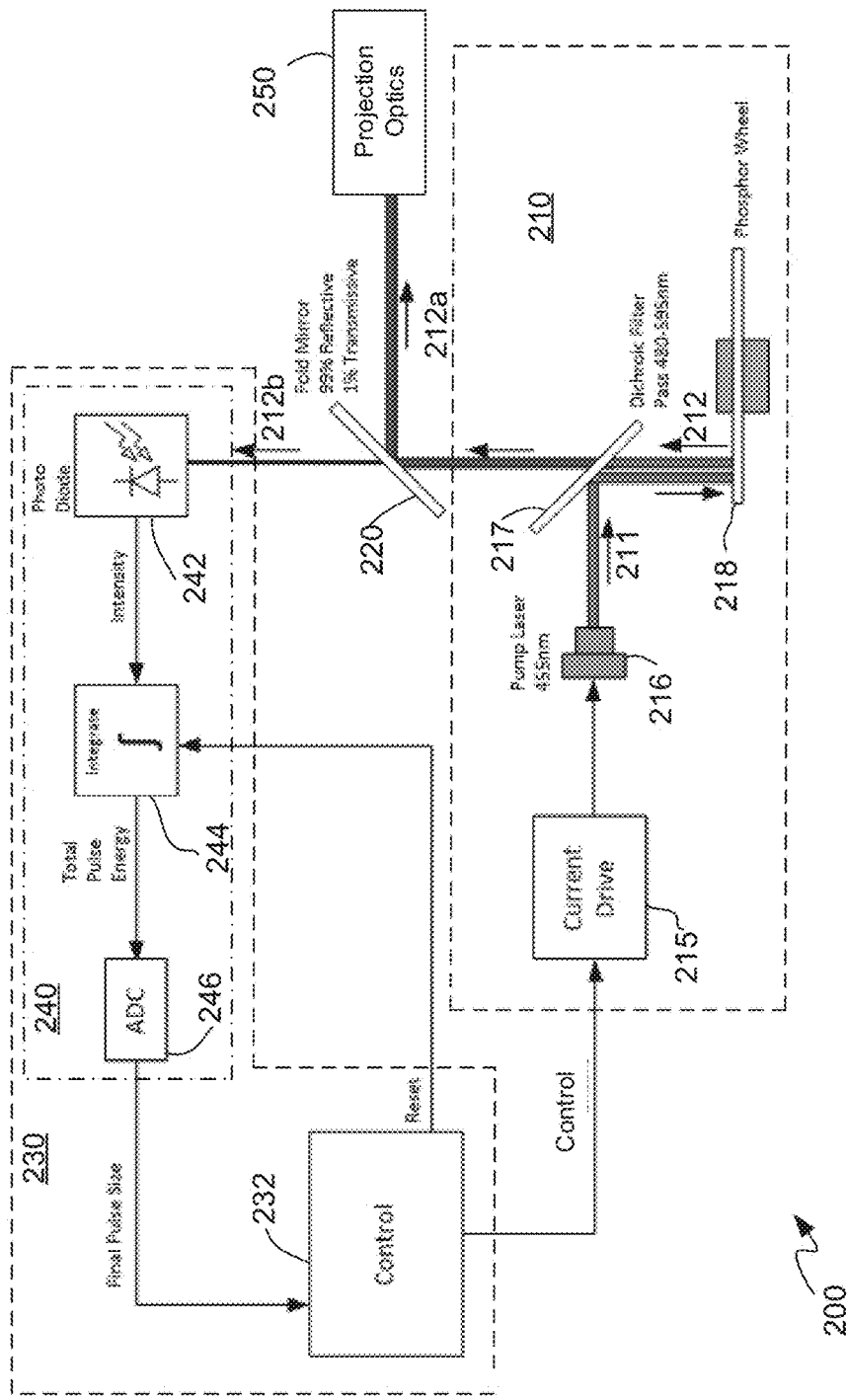
FIG. 2 depicts a light pulse system, according to a non-limiting embodiment.

Attention is now directed to FIG. 2 which depicts a light pulse system 200 for use with a projection optics system 250. The light pulse system 200 includes a light source 210 configured to emit light pulses 212, a transmission element 220, and a feedback system 230.

The light source 210 is configured to emit light pulses 212 for use with a projection optics system 250. The light source 210 comprises a pump laser 216 configured to emit laser pulses 211 and a current drive 215 configured to supply a current to the pump laser 216. In the present example, the light source 210 further comprises a dichroic filter 217 and a phosphor wheel 218. The dichroic filter 217 and the phosphor wheel 218 are configured to convert the laser pulses 211 emitted by pump laser 116 to light pulses 212. The dichroic filter 217 is a spinning color wheel which alternates between red, green and blue segments. The phosphor wheel 218 is a spinning wheel coated in a phosphor compound, wherein the phosphor is excited by the laser pulses 211 to emit colored light pulse 212 having a longer wavelength.

For example, the pump laser 216 may be a 455 nm laser, thus generating blue light. The laser pulses 211 emitted from the pump laser 216 may interact with the phosphor wheel 218 to generate light pulses 212 having longer wavelength, specifically to generate green light. The light pulses may in turn interact with the dichroic filter 217 having a pass range of about 480 nm to 595 nm for generating green light and a pass range of about 595 nm to 700 nm for generating red light. The phosphor wheel 218 and the dichroic filter 217 may comprise portions to transmit blue light directly from the pump laser 216. Thus, the pump laser 216, the dichroic filter 217 and the phosphor wheel 218 interact to generate red, green and blue light pulses 212 for transmission to the projection optics system.

In other implementations, the light source 210 may comprise the dichroic filter 217, and a static phosphor element to generate light pulses 212. Specifically, rather than the spinning phosphor wheel 218, a sample of phosphor may be bound to a substrate for generating the light pulses 212. The static phosphor element may further include elements to cool the phosphor, such as liquid cooling, thermoelectric coolers (TECs) and the like.

In other implementations, the light source 210 may comprise independent pump lasers 216 for red, green, and blue channels, and a static dichroic combiner to combine the colors. In still further implementations, the light source may comprise the pump laser 216 and a conversion element configured to receive the laser pulses 211 from the pump laser 216 and convert the laser pulses 211 to light pulses 212. The light source 210 may be otherwise suitably configured to emit red, green, and blue light pulses to the projection optics system 250. Hence, the light source 210 is similar to the light source 110.

The transmission element 220 is generally configured to transmit a first part 212a and a second part 212b of the active light pulse 212. The first part 212a is transmitted to the projection optics system 250, and the second part 212b is transmitted to the feedback system 230. In the present example, the transmission element 220 is a partially transmissive mirror that reflects the first part 212a comprising about 99% of the active light pulse 212 to the projection optics system 250 and transmits the second part 212b comprising about 1% of the active light pulse 212 to the feedback system 230. In other implementations, the transmission element 220 may be configured to transmit the first part 212a to the projection optics system 250, and reflect the second part 212b to the feedback system 230, or the transmission element 220 may have a higher or lower reflectance ratio, or otherwise be suitably configured to transmit the first part 212a to the projection optics system 250, and the second part 212b to the feedback system 230.

The feedback system 230 includes a detector 240 and a control unit 232. Generally, the feedback system 230 is configured to monitor each light pulse 212 and in response adjust a subsequent pulse.

Specifically, the detector 240 is generally configured to receive the second part 212b and determine a total measure of energy of the active light pulse 212. In some implementations, the detector may include a photodiode 242 and an integrator 244. The photodiode 242 is configured to receive the second part 212b and convert it to an electric current to transmit to the integrator 244. The integrator 244 receives the electric current and integrates it to determine the total measure of energy of the active light pulse 212. In other implementations, the detector 240 may include other suitable components for receiving the second part 212b and determining a total measure of energy of the active light pulse 212 based on the second part 212b. In some implementations, the integrator 244 outputs the total measure of energy as an analog signal, thus the detector 240 may further include an analog-to-digital converter (ADC) 246 to communicate the total measure of energy as a digital input to the control unit 232.

The control unit 232 is operatively coupled to the light source 210. Specifically, the control unit 232 is coupled to the current drive 215 of the light source 210 to control the current drive 215. The current drive 215 in turn provides the current to the pump laser 216 to cause the pump laser 216 to emit laser pulses 211. The dichroic filter 217 and the phosphor wheel 218 receive the laser pulses 211 and convert the laser pulses 211 into light pulses 212, thus causing the light source 210 to emit light pulses 212.

In contrast to the control unit 132 of the system 100, the control unit 232 is further configured to control the current from the current drive 215 to the pump laser 216, thereby controlling the amplitude of the both the laser pulses 211 and the subsequently generated light pulse 212. Specifically, the control unit 232 may increase the current from the current drive 215 to the pump laser 216, thereby increasing the amplitude of the active laser pulse 211, or the control unit may decrease the current from the current drive 215 to the pump laser 216, thereby decreasing the amplitude of the active laser pulse 211. In turn, the amplitude of the active light pulse 212 will be proportional to the amplitude of the active laser pulse 211 received by the dichroic filter 117 and the phosphor wheel 118. Hence, the active light pulse 212 will have a fixed duration, but a programmable amplitude.

The control unit 232 is configured to receive the total measure of energy of the active light pulse 212 and in response control the amplitude of a subsequent light pulse. Specifically, the total measure of energy of the active light pulse 212 is communicated to the control unit 232 and compared to an expected measure of energy. Accordingly, the control unit 232 may control the amplitude of a subsequent laser pulse and the resulting light pulse. For example, where the total measure of energy of the active light pulse 212 is lower than the expected measure of energy, the control unit 232 may increase the current from the current drive 215 to the pump laser 216, thereby increasing the amplitude of the subsequent laser pulse and the resulting light pulse.

The control unit 232 is further configured to reset the integrator 244 between light pulse. For each light pulse, the feedback system 230 may determine the total measure of energy and calibrate the light source 210 accordingly. Thus, inconsistencies in the pump laser 216 or the current drive 215 may be accommodated. Further, if the phosphor wheel 218 is operated in a synchronous manner (i.e. rotation speed is an integer multiple of the frame rate), then the generated light pulses 212 (the phosphor conversion rate) will be consistent from video frame to video frame. That is, each light pulse 212 will occur on the same portion of the phosphor wheel, thus any variations in the phosphor, such as thickness and the like, will be captured in the calibration and accounted for.

For example, the system 200 may be configured to calibrate light pulses in accordance with bit plane requirements for a DMD projector system. Accordingly, the control unit 232 may be configured to receive bit plane data from a video source. The bit plane data may include lengths of each bit plane, light requirements for each bit plane, and the like. In some implementations, the bit plane data may include the expected measure of energy for each bit plane, while in other implementations, the control unit may determine the expected measure of energy for each bit plane based on the light requirements for each bit plane.

Figure 4:
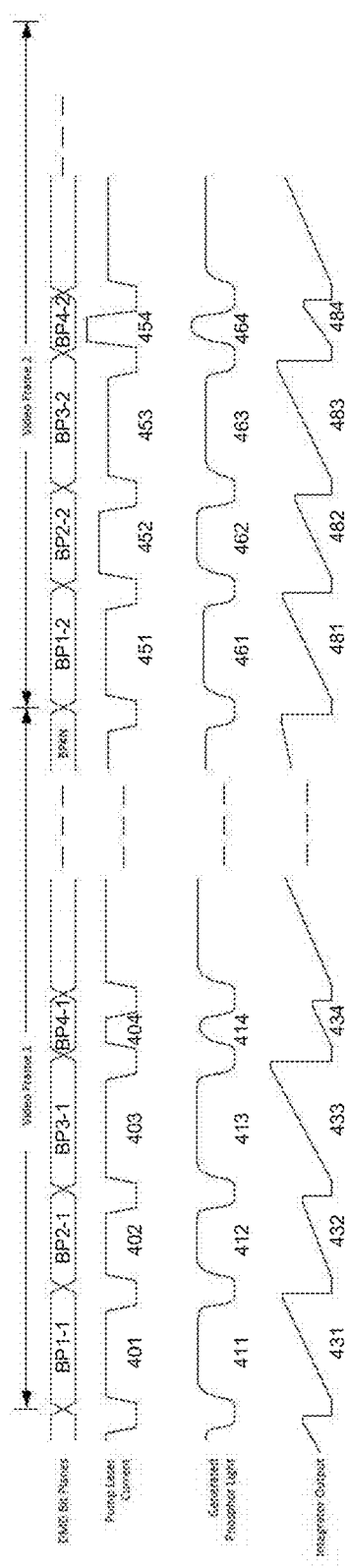
FIG. 4 depicts waveforms for light pulses in the light pulse system of FIG. 2.

FIG. 4 shows a series of waveforms of several pulses at several points in the system 200. FIG. 4 shows a series of bit planes BP1-1, BP2-1, BP3-1, and BP4-1. At the start of a given bit plane, all light sources 210 in the DMD projector will be off. The DMD mirrors will be adjusted to the required position (on state or off state). Once the mirrors have settled, the control unit 232 enables and disables the current from the current drive 215 to the pump laser 216. The output of pump laser 316 is initially set to a nominal value, thus setting the amplitude of the pump laser current pulses 401, 402, 403, 404. The control unit 232 also sets the width of the pump laser current pulses 401-404 output from pump laser 216, via current drive 215, to have a width slightly less than the corresponding bit plane width to allow for switching time.

The pump laser current pulses 401-404 impinge upon phosphor wheel 218, which in turn generates phosphor light pulses 411-414 respectively. The phosphor light pulses 411-414 correspond to the respective shapes of the pump laser current pulses, thus the phosphor light pulses 411-414 also have a common amplitude and a width slightly less than the corresponding bit plane width.

FIG. 4 also shows the integrator output waveforms 431-434 for the phosphor light pulses 411-414. The integrated output waveforms 431-434 represent the total measure of energy of the phosphor light pulses 411-414 and are communicated to the control unit 232 and compared to an expected measure of energy. In the present example, the pulses 431 and 433 measured too high, and the pulse 434 measured too low.

On the subsequent video frame comprising bit planes BP1-2, BP2-2, BP3-2, and BP4-2, pump laser current pulses 451-454, and thus the amplitude of pulses 461-464 are adjusted by the control unit 232 according to the previous integrated output waveforms 431-434. Specifically, the control unit 232 causes current drive 215 to decrease the output of pump laser 216 during bit planes BP1-2 and BP3-2, thereby decreasing the amplitudes of pump laser current pulses 451 and 453, and increase the output of pump laser 216 during bit plane BP4-2, thereby increasing the amplitude of pump laser current pulse 454. Thus, the pulses 461 and 463 have a decreased amplitude and the pulse 464 has an increased amplitude. All widths remain constant. The pulses 461-464 are integrated to produce integrator output waveforms 481-484, which may be used to calibrate the subsequent video frame. Hence, the system 200 may calibrate the laser pulses to account for inconsistencies in the pump laser 216, the current drive 215 or the phosphor conversion rate.

The calibration of the system 200 assumes that from frame to frame, the light output of the phosphor wheel 218 is consistent. This assumption will be invalidated if there is too much jitter in the speed control of the phosphor wheel 218. In a synchronous system the energy of laser pulses 211 is always deposited in the same location on the phosphor wheel 218. This leads to spot heating. An asynchronous wheel will have better thermal performance, but invalidates the consistency assumption. Thus, in an asynchronous system, the calibration data captured from a previous video frame may not lead to an accurate expected performance of the next video frame.

Figure 3:
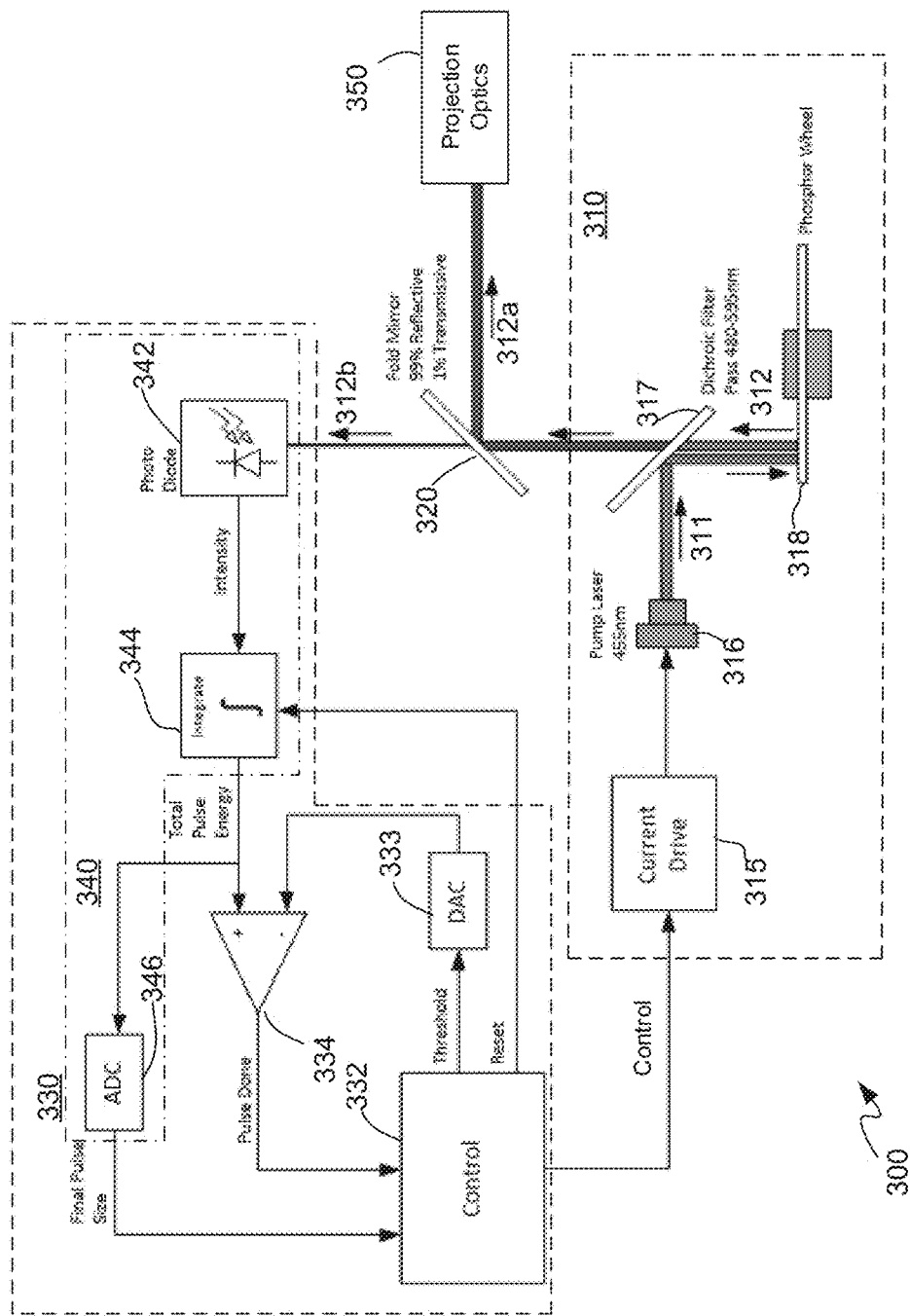
FIG. 3 depicts a light pulse system, according to a further non-limiting embodiment.

FIG. 3 depicts a light pulse system 300 for use with a projection optics system 350, according to a further embodiment. The light pulse system 300 includes a light source 310 configured to emit light pulses 312, a transmission element 320, and a feedback system 330.

The light source 310 is configured to emit laser pulses 311 for use with a projection optics system 350. The light source 310 is similar to the light sources 210 and 110. Specifically, the light source 310 includes a pump laser 316 configured to emit laser pulses 311 and a current drive 315 configured to supply a current to the pump laser 316. In the present example, the light source 310 further comprises a dichroic filter 317 and a phosphor wheel 318. The dichroic filter 317 and the phosphor wheel 318 are configured to convert the laser pulses 311 emitted by pump laser 316 to light pulses 312. The dichroic filter 317 is a spinning color wheel which alternates between red, green and blue segments. The phosphor wheel 318 is a spinning wheel coated in a phosphor compound, wherein the phosphor is excited by the laser pulses 311 to emit colored light pulses 312 having a longer wavelength.

For example, the pump laser 316 may be a 455 nm laser, thus generating blue light. The laser pulses 311 emitted from the pump laser 316 may interact with the phosphor wheel 318 to generate light pulses 312 having longer wavelength, specifically to generate green light. The light pulses may in turn interact with the dichroic filter 317 having a pass range of about 480 nm to 595 nm for generating green light and a pass range of about 595 nm to 700 nm for generating red light. The phosphor wheel 318 and the dichroic filter 317 may comprise portions to transmit blue light directly from the pump laser 316. Thus, the pump laser 316, the dichroic filter 317 and the phosphor wheel 318 interact to generate red, green and blue light pulses 312 for transmission to the projection optics system.

In other implementations, the light source 310 may comprise the dichroic filter 317 and a static phosphor element to generate light pulses 312. Specifically, rather than the spinning phosphor wheel 318, a sample of phosphor may be bound to a substrate for generating light pulses 312. The static phosphor element may further include elements to cool the phosphor, such as liquid cooling, TECs and the like.

In other implementations, the light source 310 may comprise independent pump lasers 316 for red, green, and blue channels, and a static dichroic combiner to combine the colors. In still further implementations, the light source may comprise the pump laser 316 and a conversion element configured to receive the laser pulses 311 from the pump laser 316 and convert the laser pulses 311 to light pulses 312. The light source 310 may also comprise a pump laser of a different wavelength, and a dichroic filter having a different pass range, or the light source 310 is otherwise suitably configured to emit red, green, and blue light pulses to the projection optics system 350.

The transmission element 320 is similar to the transmission element 220. The transmission element 320 is generally configured to transmit a first part 312a and a second part 312b of the active light pulse 312. The first part 312a is transmitted to the projection optics system 350, and the second part 312b is transmitted to the feedback system 330. In the present example, the transmission element 320 is a partially transmissive mirror that reflects the first part 312a comprising about 99% of the active light pulse 312 to the projection optics system 350 and transmits the second part 312b comprising about 1% of the active light pulse 312 to the feedback system 330. In other implementations, the transmission element 320 may be configured to transmit the first part 312a to the projection optics system 350, and reflect the second part 312b to the feedback system 330, or the transmission element 320 may have a higher or lower reflectance ratio, or otherwise be suitably configured to transmit the first part 312a to the projection optics system 350, and the second part 312b to the feedback system 330.

The feedback system 330 includes a detector 340, a comparator 334, and a control unit 332. Generally, the feedback system 330 is configured to monitor each active light pulse 312 and in response adjust the active light pulse 312 as well as subsequent light pulses.

The detector 340 is similar to the detector 240. The detector 340 is generally configured to receive the second part 312b and determine a total measure of energy of the active light pulse 212. In some implementations, the detector may include a photodiode 342 and an integrator 344. The photodiode 342 is configured to receive the second part 312b and convert it to an electric current to transmit to the integrator 344. The integrator 344 receives the electric current and integrates it to determine the total measure of energy of the active light pulse 312. In other implementations, the detector 340 may include other suitable components for receiving the second part 312b and determining a total measure of energy of the active light pulse 312 based on the second part 312b. In some implementations, the integrator 344 outputs the total measure of energy as an analog signal, thus the detector 340 may further include an ADC 346 to communicate the total measure of energy as a digital input to the control unit 332.

The comparator 334 is configured to receive a threshold value and the total measure of energy of the active light pulse 312 and cause the control unit to stop the active light pulse 312 when said total measure exceeds the threshold value, thereby controlling the width of the active light pulse. Specifically, the comparator 334 compares the integrated total measure of the active light pulse 312 to the threshold value and produces a pulse done signal when the integrated total measure exceeds the threshold value. The pulse done signal is communicated to the control unit 332.

The control unit 332 is operatively coupled to the light source 310. Specifically, the control unit 332 is coupled to the current drive 315 of the light source 310 to control the current drive 315. The current drive 315 in turn activates and deactivates the current supplied to the pump laser 316 to cause the pump laser 316, and thus the light source 310, to emit light pulses.

As with the control unit 232, the control unit 332 is configured to control the current from the current drive 325 to the pump laser 316, thereby controlling the amplitude of the active laser pulse 311 and the subsequently generated active light pulse 312. The control unit 332 receives the total measure of energy of the active light pulse 312 and in response controls the amplitude of a subsequent light pulse. Specifically, the total measure of energy of the active light pulse 312 is communicated to the control unit 332 and compared to an expected measure of energy. Accordingly, the control unit 332 may control the amplitude of the subsequent light pulses.

The control unit 332 is further configured to receive the pulse done signal from the comparator 334. Upon receiving the pulse done signal, the control unit 332 is configured to deactivate the current from the current drive 315 to the pump laser 316. The control unit 332 is further configured to set the threshold value. The control unit 332 may express the threshold value as a digital signal, thus, in some implementations, the feedback system 330 may further include a programmable digital-to-analog converter (DAC) 333 configured to receive the threshold value from the control unit, and communicate the threshold value to the comparator 334 as an analog signal. The control unit 332 is configured to reset the integrator 344 between light pulses, thus, for each active light pulse 312, the feedback system 330 may determine the total measure of energy and control the light source 310 accordingly.

For example, the system 300 may be configured to control the light pulses in accordance with bit plane requirements for a DMD projector system. Accordingly, the control unit 332 may be configured to receive bit plane data from a video source. The bit plane data may include lengths of each bit plane, light requirements for each bit plane, and the like. In some implementations, the bit plane data may include the expected measure of energy for each bit plane, while in other implementations, the control unit may determine the expected measure of energy for each bit plane based on the light requirements for each bit plane. Similarly, the bit plane data may include the threshold values for each bit plane, or the control unit may determine the threshold values for each bit plane based on the light requirements for each bit plane.

Figure 5:
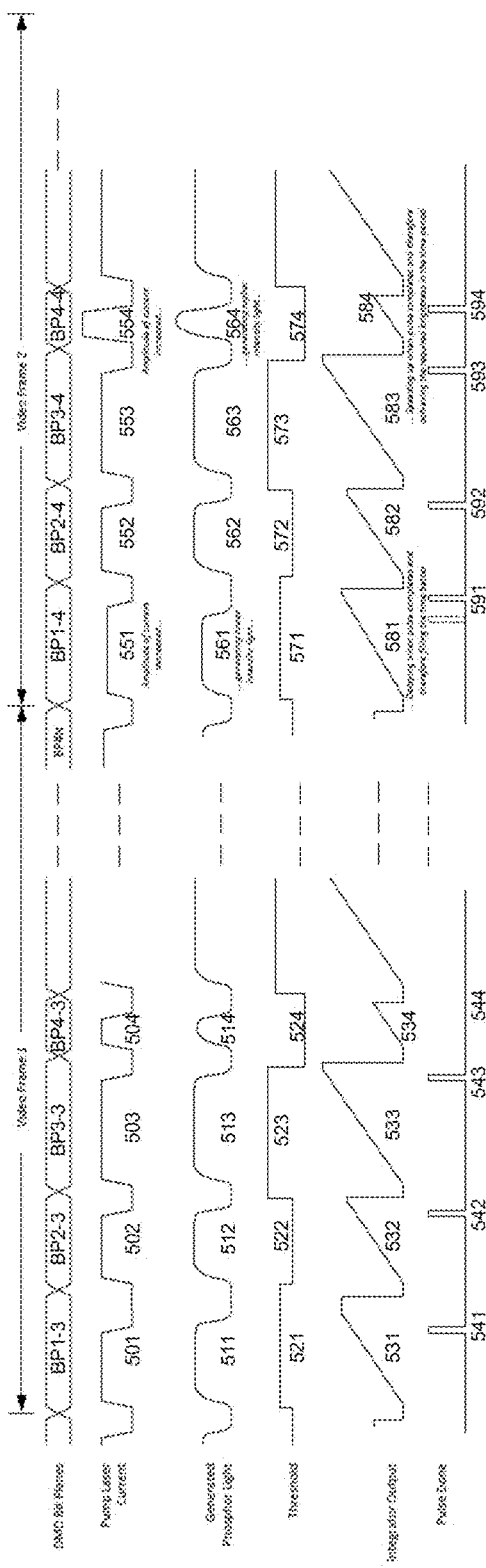
FIG. 5 depicts waveforms for light pulses in the light pulse system of FIG. 3.

FIG. 5 shows a series of waveforms of several pulses at several points in the system 300. FIG. 5 shows a series of bit planes BP1-3, BP2-3, BP3-3 and BP4-3. At the start of a given bit plane, all light sources 310 in the DMD projector will be off. The DMD mirrors will be adjusted to the required position (on state or off state). Once the mirrors have settled, the control unit 332 enables the current from the current drive 315 to the pump laser 316. The output of the pump laser 316 is initially set to a nominal value, thus setting the amplitude of pump laser current pulses 501, 502, 503, 504. The control unit 332 also sets the width of the pump laser current pulses 501-504 output from pump laser 316, via the DAC 333 setting the threshold value as described above. In some implementations, the control unit 332 may set a maximum width in the event the pulse done signal is not produced within the allotted bit plane time. For example, the maximum width may be slightly less than the corresponding bit plane width to allow for switching time.

The pump laser current pulses 501-504 impinge on phosphor wheel 318, which in turn generates phosphor light pulses 511-514 respectively. The phosphor light pulses 511-514 correspond to the respective shapes of the pump laser current pulses 501-504, thus the phosphor light pulses 511-514 also have a common amplitude and a maximum width slightly less than the corresponding bit plane width.

FIG. 5 also shows threshold values 521-524, and integrated output waveforms 531-534 for the phosphor light pulses 511-514 respectively. The integrated output waveforms 531-534 represent the total measure of energy of the phosphor light pulses 511-514. The threshold values 521-524 may interact with the integrated output waveforms 531-534 via the comparator 334 to set the width of each pulse. Specifically, the threshold values 521-524 and the integrated output waveforms 531-534 are fed to the comparator 334, which produces pulse done signals 541-544 when the respective integrated output waveforms 531-534 exceed the respective threshold values 521-524. The pulse done signals 541-544 are communicated to the control unit 332, which disables the current from the current drive 315 to the pump laser 316 to end the respective pump laser current pulses 501-504, and thus the respective phosphor light pulses 511-514.

In the present example, the phosphor light pulse 511 produced the integrated output waveform 531 which triggered the pulse done signal 541 well before the time allocated within the bit plane BP1-3. Thus, the pulse amplitude is too high and may be decreased. The pulse phosphor light pulse 514 produced the integrated output waveform 534 which did not trigger the pulse done signal 544, thus the pulse amplitude is too low and may be increased.

On the subsequent video frame comprising bit planes BP1-4, BP2-4, BP3-4, and BP4-4, pump laser current pulses 551-554, and thus the amplitude of phosphor light pulses 561-564 are adjusted by the control unit 332 according to the previous integrated output waveforms 531-534. Specifically, the control unit 332 causes current drive 315 to decrease the output of the pump laser 316 during bit plane BP1-4, thereby decreasing the amplitude of the pump laser current pulse 551, and increase the output of the pump laser 316 during bit plane BP4-4, thereby increasing the amplitude of the pump laser current pulse 554. Thus, the phosphor light pulse 561 has an decreased amplitude and the phosphor light pulse 564 has an increased amplitude.

The phosphor light pulses 561-564 are integrated to produce integrated output waveforms 581-584. The integrated output waveforms 581-584 are compared to threshold values 571-574 to produce pulse done signals 591-594 when the respective integrated output waveforms 581-584 exceed the respective threshold values 571-574. The pulse done signals 591-594 are communicated to the control unit 332, which disables the current drive 315 to end the respective phosphor light pulses 561-564. Accordingly, by adjusting the amplitude and setting the pulse width dynamically using the pulse done signals 591-594, the widths of the phosphor light pulses 561-564 are also adjusted. Specifically, since the phosphor light pulse 561 has a decreased amplitude, the integrated output waveform 581 will take longer to exceed the threshold value 571. Thus, the pulse done signal 591 will be produced closer to the end of the allocated time for BP1-4, and thus the width of the pump laser current pulse 551 and the phosphor light pulse 561 will be increased. Similarly, since the phosphor light pulse 564 has an increased amplitude, the integrated output waveform 584 may exceed the threshold value 574 during the allocated time for BP4-4. The width of the pump laser current pulse 554 and the phosphor light pulse 564 may thus be decreased. Further, any pulse that does not meet its expected measured size may have its threshold value adjusted until the integrated value is met. Amplitude will be increased if the pulse done signal is too late, and decreased if the pulse done signal is too early.

Hence, the system 300 may control the light pulses to account for inconsistencies in the output of the phosphor wheel 318. Specifically, the system 300 overcomes uncertainty into the expected performance of the phosphor conversion rate by responding to generated light in real time, regardless of the synchronicity of the phosphor wheel 318. The system 300 ensures that light is generated quickly enough to complete within the allocated bit plane time, and allows the system to compensate for switching uncertainty, such as the time lag between turning the light source 310 off, and light ceasing to be generated.

Figure 6:
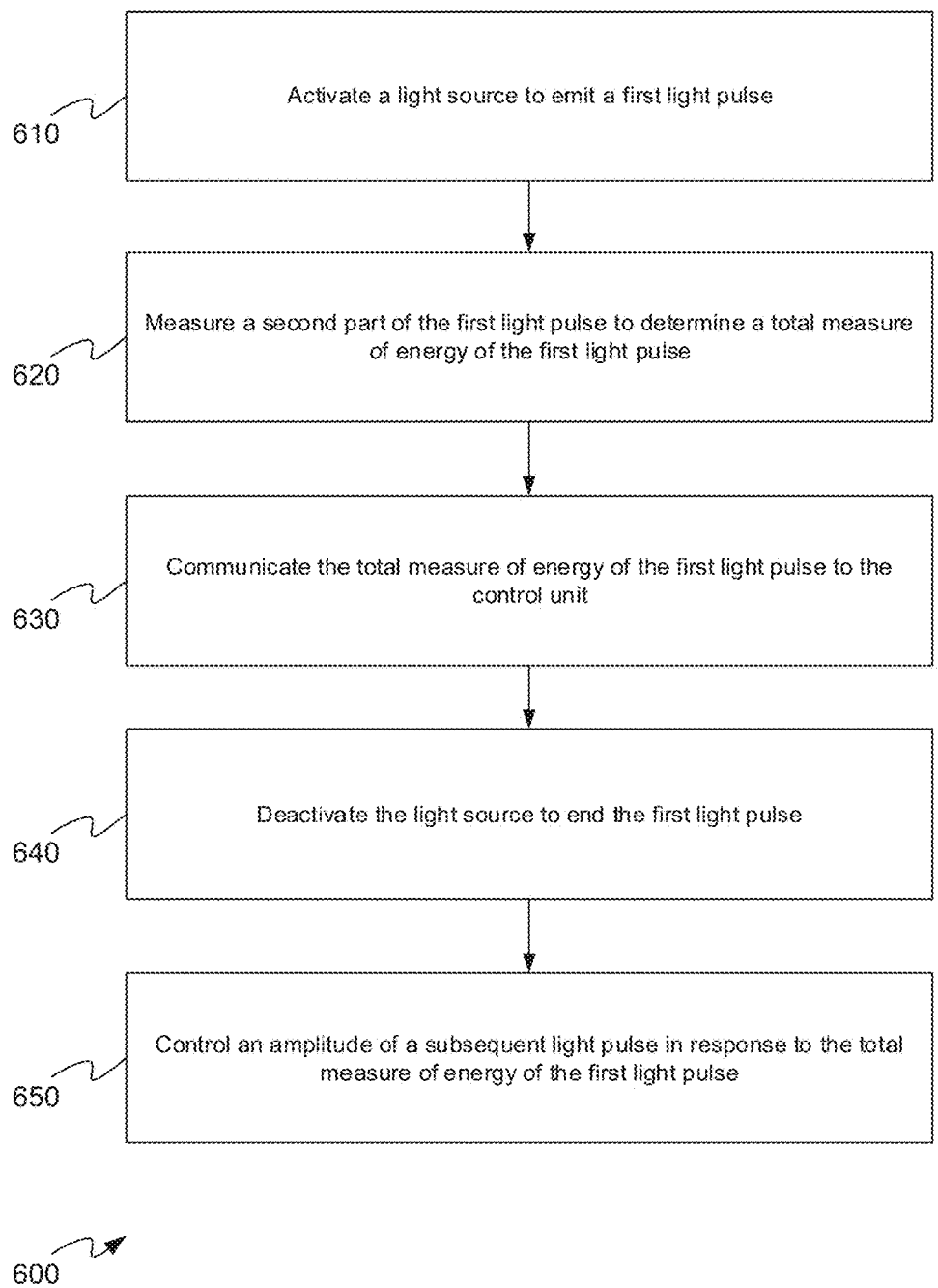
FIG. 6 depicts a method for calibrating light pulses.

Having described the components of system 200, the operation of system 200 will now be described in detail, with reference to FIG. 6. FIG. 6 depicts a method 600 of calibrating light pulses emitted by a light source. To assist in the explanation of the method 600, it will be assumed that the method 600 is performed using the system 200, although it is contemplated that method 600 can also be performed by other suitable systems, such as system 300. It is noted that method 600 need not be performed in the exact sequence shown, hence the parts of method 600 are referred to as blocks, not steps.

At block 610, the light source 210 is activated via the control unit 232 to emit an active light pulse 212.

At block 620, the detector measures the second part 212b of the active light pulse 212. In particular, the photodiode 242 receives the second part 212b and converts it to an electric current. The electric current is received by the integrator 244 which integrates the electric current to determine the total measure of energy of the active light pulse 212.

At block 630, the total measure of energy is communicated to the control unit 232. In particular, the integrator 244 may produce an analog signal representing the total measure of energy. The ADC 246 receives the total measure of energy from the integrator 244 and converts the analog signal to a digital signal to communicate to the control unit 232.

At block 640, the light source 210 is deactivated via the control unit 232 to end the active light pulse 212.

At block 650, the control unit 232 may control an amplitude of a subsequent light pulse in response to the total measure of energy of the active light pulse 212. In particular, the control unit 232 may increase the current from the current drive 215 to the pump laser 216 to increase the amplitude of the subsequent light pulse if the total measure of energy is lower than an expected measure, and may decrease the current from the current drive 215 to the pump laser 216 to decrease the amplitude of the subsequent light pulse if the total measure of energy is higher than the expected measure.

Figure 7:
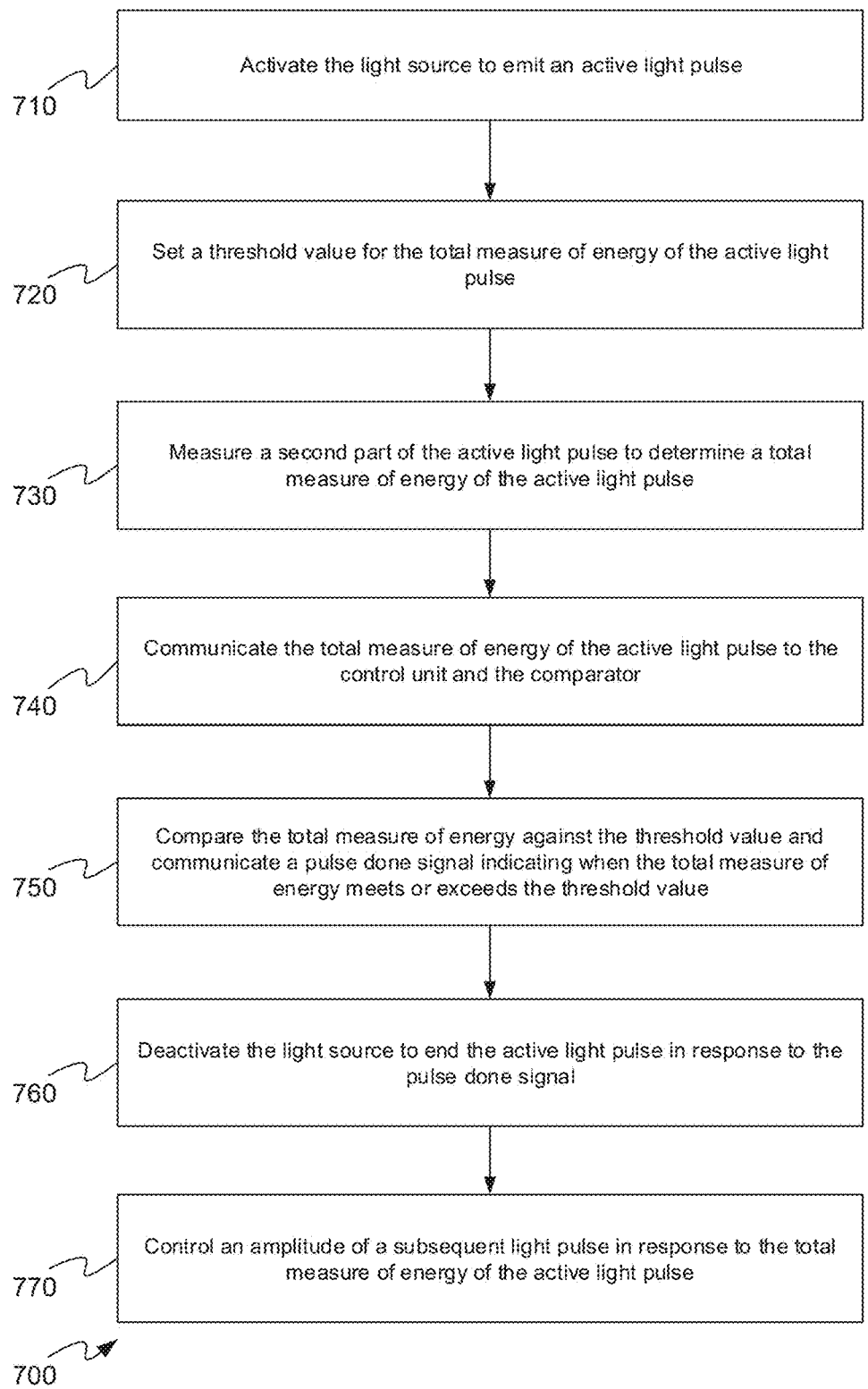
FIG. 7 depicts a method for controlling energy of light pulses.

Having described the components of system 300, the operation of system 300 will now be described in detail, with reference to FIG. 7. FIG. 7 depicts a method 700 of controlling an energy of light pulses emitted by a light source. In order to assist in the explanation of the method 700, it will be assumed that the method 700 is performed using the system 300, although it is contemplated that method 700 can also be performed by other suitable systems. It is noted that method 700 need not be performed in the exact sequence shown, hence the parts of method 700 are referred to as blocks, not steps.

At block 710, the light source 310 is activated via the control unit 332 to emit an active light pulse 212.

At block 720, the control unit 332 sets a threshold value for the total measure of energy of the active light pulse. For example, the threshold value may correspond to the minimum amount of light needed for the active bit plane. In another example, the threshold value may correspond to the minimum amount of light needed for the active bit plane including a margin to allow for turn-off time.

At block 730, the detector 340 measures the second part 312b of the active light pulse 312 to determine a total measure of energy of the active light pulse 312. In particular, the photodiode 342 receives the second part 312b and converts it to an electric current. The electric current is received by the integrator 344 which integrates the electric current to determine the total measure of energy of the active light pulse 312.

At block 740, the total measure of energy of the active light pulse 312 is communicated to the control unit 332 and the comparator 334. In particular, the integrator 344 may produce an analog signal representing the total measure of energy of the active light pulse 312. The analog signal may be communicated directly to the comparator 334. The ADC 346 may receive the total measure of energy of the active light pulse 312 from the integrator 344 and convert the analog signal to a digital signal to communicate to the control unit 332.

At block 750, the comparator 334 may compare the total measure against the threshold, and communicate a pulse done signal to the control unit 332, the pulse done signal indicating when the threshold value has been met or exceeded by the total measure of energy of the active light pulse 312.

At block 760, the light source 310 is deactivated via the control unit 332 to end the active light pulse 312 in response to the pulse done signal. In particular, when the pulse done signal is communicated to the control unit 332, the control unit 332 may deactivate the light source 310.

At block 770, the control unit 332 may control an amplitude of a subsequent light pulse in response to the total measure of energy of the active light pulse 312 and the pulse done signal. In particular, where the pulse done signal does not occur and the total measure of energy is lower than the expected measure, the amplitude of the subsequent light pulse will be increased. Where the pulse done signal occurs before the allocated time for the bit plane, the amplitude of the subsequent light pulse will be decreased. In addition, the threshold value may be adjusted to adjust the total measure of energy of the subsequent light pulse.

Adjusting the amplitude without adjusting the threshold value results in a change of shape of the pulse, but a constant total measure of energy. Adjusting just the threshold value without adjusting the amplitude results in a change in the total measure of energy, but may also change the width of the pulse. Thus, the control unit 332 may control both the amplitude and the threshold value for the subsequent light pulse to maintain a balanced width while appropriately adjusting the total measure of energy produced by the light pulse. In some examples, the control unit 332 may decrease the amplitude and the threshold value correspondingly to reduce peak laser powers to get better thermal performance.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A light pulse system for use with a projection optics system, the light pulse system comprising:
    a light source comprising a pump laser configured to emit laser pulses, a current drive configured to supply a current to the pump laser and a conversion element configured to convert the laser pulses to light pulses;
    a transmission element configured to transmit a first part and a second part of an active light pulse, the first part being transmitted to the projection optics system; and
    a feedback system comprising:
        a detector configured to receive the second part of the active light pulse and determine a total measure of energy of the active light pulse;
        a control unit configured to receive said total measure of energy of the active light pulse and in response control an amplitude of a subsequent light pulse by adjusting the current from the current drive to the pump laser; and
        a comparator for receiving a threshold value and said total measure of energy of the active light pulse and causing the control unit to stop the active light pulse when said total measure exceeds said threshold value, thereby controlling a width of the active light pulse.

2. The light pulse system of claim 1 wherein the control unit is further configured to set the threshold value.

3. The light pulse system of claim 2 further comprising a programmable digital-to-analog converter configured to receive the threshold value from the control unit and to communicate the threshold value to the comparator.

4. The light pulse system of claim 2 wherein the control unit is further configured to receive bit plane data and to set the threshold value according to the bit plane data.

5. The light pulse system of claim 1 wherein the transmission element comprises a partially transmissive mirror configured to reflect the first part of the active light pulse to the projection optics system and transmit the second part of the active light pulse to the feedback system.

6. The light pulse system of claim 1 wherein the detector comprises:
    a photodiode configured to receive the second part of the active light pulse and convert it to an electric current; and
    an integrator coupled to the photodiode to receive the electric current and to integrate the electric current to determine the total measure of energy of the active light pulse.

7. The light pulse system of claim 6 wherein the control unit is further configured to reset the integrator at an end of the active light pulse.

8. The light pulse system of claim 1 further comprising an analog-to-digital converter configured to receive total measure of energy of the active light pulse and cause the control unit to control the amplitude of the active light pulse in accordance with the total measure of energy of the active light pulse.

9. The light pulse system of claim 1 wherein the conversion element of the light source comprises a dichroic filter and a phosphor wheel configured to receive laser pulses from the pump laser and generate colored light pulses for the projection optics system.

10. The light pulse system of claim 1 wherein the conversion element of the light source comprises a dichroic filter and a static phosphor element configured to receive laser pulses from the pump laser and generate colored light pulses for the projection optics system.

11. The light pulse system of claim 1 wherein the control unit is further configured to receive bit plane data and to control a width of the active light pulse according to the bit plane data.

12. The light pulse system of claim 1 wherein the control unit is further configured to receive bit plane data and to control the amplitude of the active light pulse and the subsequent light pulse according to the bit plane data.

13. A method of controlling an energy of a pulse emitted by a light source comprising:
    activating the light source to emit an active light pulse;
    measuring a part of the active light pulse to determine a total measure of energy of the active light pulse;
    deactivating the light source to end the active light pulse;
    controlling an amplitude of a subsequent light pulse in response to the total measure of energy of the active light pulse;
    setting a threshold value for the total measure of energy of the active light pulse;
    comparing the total measure of energy of the active light pulse against the threshold value; and
    deactivating the light source when the threshold value has been met or exceeded by the total measure of energy of the active light pulse.

14. The method of claim 13 wherein the measuring comprises:
    receiving the part of the active light pulse and converting it to an electric current; and
    integrating the electric current to determine the total measure of energy of the active light pulse.

15. The method of claim 13 further comprising receiving bit plane data and wherein the deactivating comprises deactivating the light source to end the active light pulse according to the bit plane data.

16. The method of claim 13 further comprising receiving bit plane data and controlling an amplitude of the active light pulse according to the bit plane data.

17. The method of claim 13 further comprising receiving bit plane data and setting the threshold value according to the bit plane data.

* * * * *